United States Patent
Matsuda

(10) Patent No.: US 6,924,440 B2
(45) Date of Patent: Aug. 2, 2005

(54) PRINTED WIRING BOARD, APPARATUS FOR ELECTRICALLY CONNECTING AN ELECTRONIC ELEMENT AND A SUBSTRATE, AND METHOD FOR MANUFACTURING A PRINTED WIRING BOARD

(75) Inventor: Yoshinari Matsuda, San Diego, CA (US)

(73) Assignees: Sony Corporation, Tokyo (JP); Sony Electronics, Inc., Park Ridge, NJ (US)

(*) Notice: Subject to any disclaimer, the term of this patent is extended or adjusted under 35 U.S.C. 154(b) by 14 days.

(21) Appl. No.: 10/401,667

(22) Filed: Mar. 28, 2003

(65) Prior Publication Data

US 2004/0188137 A1 Sep. 30, 2004

(51) Int. Cl.[7] ................................. H05K 1/09
(52) U.S. Cl. .................. 174/256; 174/260; 174/261; 228/207
(58) Field of Search ................ 174/260, 262, 174/261, 255, 250; 361/760, 767, 771; 228/180.1, 207, 248.1, 223, 248.5, 224; 29/832, 852

(56) References Cited

U.S. PATENT DOCUMENTS

| 3,500,538 | A | * | 3/1970 | Raciti ........................ 29/825 |
| 4,139,881 | A | * | 2/1979 | Shimizu et al. ............. 361/760 |
| 4,761,881 | A | * | 8/1988 | Bora et al. ..................... 29/840 |
| 5,005,766 | A | * | 4/1991 | Heiner ........................ 239/214 |
| 5,152,451 | A | * | 10/1992 | Darveaux et al. ...... 228/180.21 |
| 5,172,852 | A | * | 12/1992 | Bernardoni et al. ... 228/180.21 |
| 5,373,985 | A | * | 12/1994 | Chiba et al. ............. 228/180.1 |
| 6,617,529 | B2 | * | 9/2003 | Ishizuka et al. ........... 174/266 |
| 6,697,151 | B2 | * | 2/2004 | Owen et al. ............. 356/237.1 |
| 6,768,197 | B2 | * | 7/2004 | Hosomi et al. ............. 257/737 |

FOREIGN PATENT DOCUMENTS

JP         406350249 A    * 12/1994

* cited by examiner

*Primary Examiner*—Kamand Cuneo
*Assistant Examiner*—Ishwar (I. B.) Patel
(74) *Attorney, Agent, or Firm*—Mayer Fortkort & Williams PC; Heather L. Mansfield, Esq.; Karin L. Williams, Esq.

(57) ABSTRACT

An apparatus for electrically connecting an electronic element and a base includes an electrode region and a terminal region proximate the electrode region. A conductive paste is deposited on at least a portion of the terminal region. The conductive paste has an oxidation-reduced region thereon, formed by application of an acid to the conductive paste. An oxidation-prevention layer is formed on the oxidation-reduced region by deposition of a flux on the oxidation-reduced region, application of a solder to the flux, and blowing of a heated gas by the solder. The oxidation-prevention layer is adapted to bond the electrode associated with the electronic element to the conductive paste by soldering, when the electrode is present in the electrode region.

11 Claims, 4 Drawing Sheets

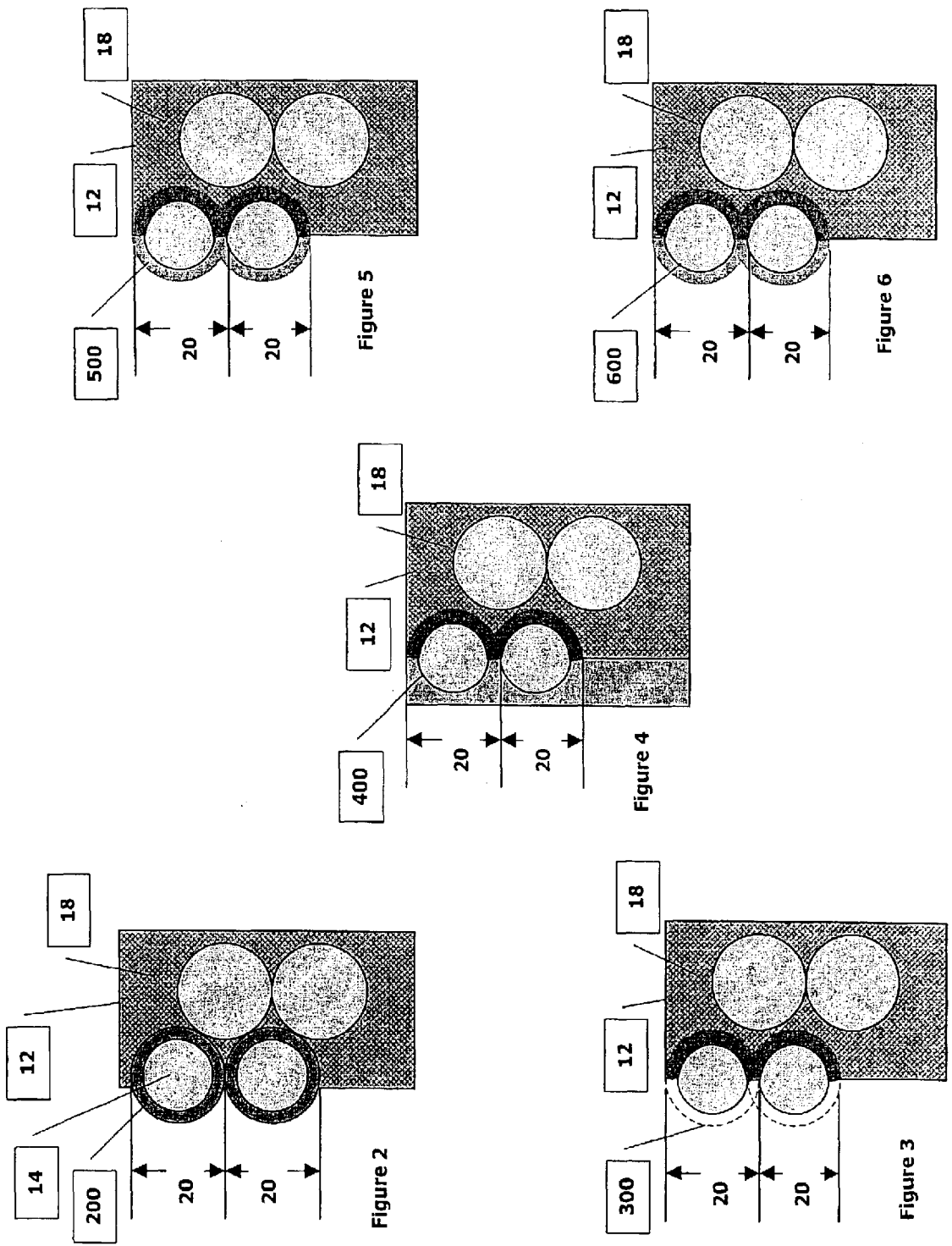

PRINTED WIRING BOARD, APPARATUS FOR ELECTRICALLY CONNECTING AN ELECTRONIC ELEMENT AND A SUBSTRATE, AND METHOD FOR MANUFACTURING A PRINTED WIRING BOARD

FIELD OF THE INVENTION

Aspects of this invention relate generally to terminal connections for electronic elements, and, more particularly, to a printed wiring board, an apparatus for electrically connecting an electronic element and a substrate, and a method for manufacturing a printed wiring board.

BACKGROUND OF THE INVENTION

Electronic elements, such as integrated circuits and electronic components, are commonly mounted to substrates such as dies, component or sub-assembly packages, and printed wiring boards.

A typical printed wiring board includes a base layer of an electrically insulating material, such as phenol resin. One side of the board is designed for mounting one or more electronic elements having electrodes, such as conductive pins. Apertures, or through-holes, in the board are designed to receive the conductive pins. The other side of the board houses one or more regions at or near the through-holes, where external terminals, such as solder terminals, may be applied to the conductive pins.

Because it is important to establish reliable electrical connections within and between electronic elements mounted on a substrate, solder terminals for conductive pins have traditionally been strengthened through the use of assembly parts, such as eyelets, or by plating through-holes with copper. Solderability has also been improved, and cost reduced, by filling the through-holes and/or the terminal regions with a conductive paste. Conductive pastes are compounds of conductive metal particles, such as copper, silver, nickel, tin, and lead and its alloys, and binding resins, mixed in predetermined amounts, applied in semi-liquid paste states, then hardened by a process such as thermosetting.

When such copper-containing conductive pastes are exposed to air, however, a layer of oxidation tends to form on the surface of the conductive paste. The oxidation layer may act as an insulator, compromising solder terminals formed on or near the oxidation layer.

One way to enhance solderability of the conductive paste is to apply a film of silver to the surface of the conductive paste prior to hardening it. If, however, a portion of the silver melts down or migrates during soldering, solder terminals may still suffer from reduced integrity, silver may contaminate the solder bath, and insulation in other areas of the board may be compromised.

There are, therefore, needs for structures and methods for electrically connecting an electronic element and a substrate such as a printed wiring board, which use copper conductive paste, and which have improved solderability and terminal strength, without requiring a silver film to be deposited on the conductive paste.

SUMMARY OF THE INVENTION

According to an aspect of the present invention, the foregoing need is addressed by a printed wiring board, which includes a base having an electrode region configured to receive an electrode associated with an electronic element. A terminal region is proximate the base. A conductive paste is deposited on at least a portion of the terminal region, and has an oxidation-reduced region thereon, formed by application of an acid to the conductive paste. An oxidation-prevention layer is formed on the oxidation-reduced region by deposition of a flux on the oxidation-reduced region, application of a solder to the flux, and blowing of a heated gas by the solder. The oxidation-prevention layer is adapted to bond the electrode associated with the electronic element and the conductive paste by soldering, when the electrode is present in the electrode region.

According to a first embodiment of another aspect of the present invention, an apparatus for electrically connecting an electronic element and a base is provided. The apparatus includes an electrode region, and a terminal region proximate the electrode region. A conductive paste is deposited on at least a portion of the terminal region. The conductive paste has an oxidation-reduced region thereon, formed by application of an acid to the conductive paste. An oxidation-prevention layer is formed on the oxidation-reduced region by deposition of a flux on the oxidation-reduced region, application of a solder to the flux, and blowing of a heated gas by the solder. The oxidation-prevention layer is adapted to bond the electrode associated with the electronic element to the conductive paste by soldering, when the electrode is present in the electrode region.

According to a second embodiment of another aspect of the present invention, an apparatus for electrically connecting an electronic element and a base is provided. The apparatus includes an electrode region, and a terminal region proximate the electrode region. A conductive paste is deposited on at least a portion of the terminal region. The conductive paste has an oxidation-reduced region thereon, formed by application of an acid to the conductive paste. An oxidation-prevention layer is formed on the oxidation-reduced region by applying a rustproof agent to the oxidation-reduced region, and depositing a preflux onto the rustproof agent. The oxidation-prevention layer is adapted to bond the electrode associated with the electronic element to the conductive paste by soldering, when the electrode is present in the electrode region.

According to a first embodiment of a further aspect of the present invention, a method for manufacturing a printed wiring board includes the steps of providing an electrode region on a base, the electrode region configured to receive an electrode associated with an electronic element and having a passage through the base; forming a terminal region proximate the electrode region, by depositing a conductive paste at least in part extending into the passage; applying an acid to the terminal region to form an oxidation-reduced region, the acid removing oxidation on at least a portion of the terminal region; depositing a flux on the oxidation-reduced region; applying a solder to the flux via a solder bath; and forming a solder layer on the oxidation-reduced region, by blowing a heated gas by the solder, the solder layer adapted to bond the electrode associated with the electronic element to the terminal regions by soldering, when the electrode is present in the electrode region.

According to a second embodiment of a further aspect of the present invention, a method for manufacturing a printed wiring board includes the steps of providing an electrode region on a base, the electrode region configured to receive an electrode associated with an electronic element and having a passage through the base; forming a terminal region proximate the electrode region, by depositing a conductive paste at least in part extending into the passage;

applying an acid to the terminal region to form an oxidation-reduced region, the acid removing oxidation on at least a portion of the terminal region; applying a rustproof agent to the oxidation-reduced region; and depositing a preflux on the rustproof agent, the preflux adapted to bond the electrode associated with the electronic element to the terminal region by soldering, when the electrode is present in the electrode region.

BRIEF DESCRIPTION OF THE DRAWINGS

FIG. 2 is a partial view of through-holes of the printed wiring board shown in FIG. 1, illustrating oxidation formed thereon.

FIG. 3 illustrates oxidation-reduced regions associated with the through-holes shown in FIG. 2, in accordance with an aspect of the present invention.

FIG. 4 illustrates deposition of a flux on the oxidation-reduced regions shown FIG. 3, in accordance with another aspect of the present invention.

FIG. 5 illustrates oxidation-prevention layers formed on the flux shown in FIG. 4, in accordance with a first embodiment of a further aspect of the present invention.

FIG. 6 illustrates oxidation-prevention layers formed on the oxidation-reduced regions shown in FIG. 3, in accordance with a second embodiment of a further aspect of the present invention.

DETAILED DESCRIPTION OF THE INVENTION

Figure 1:
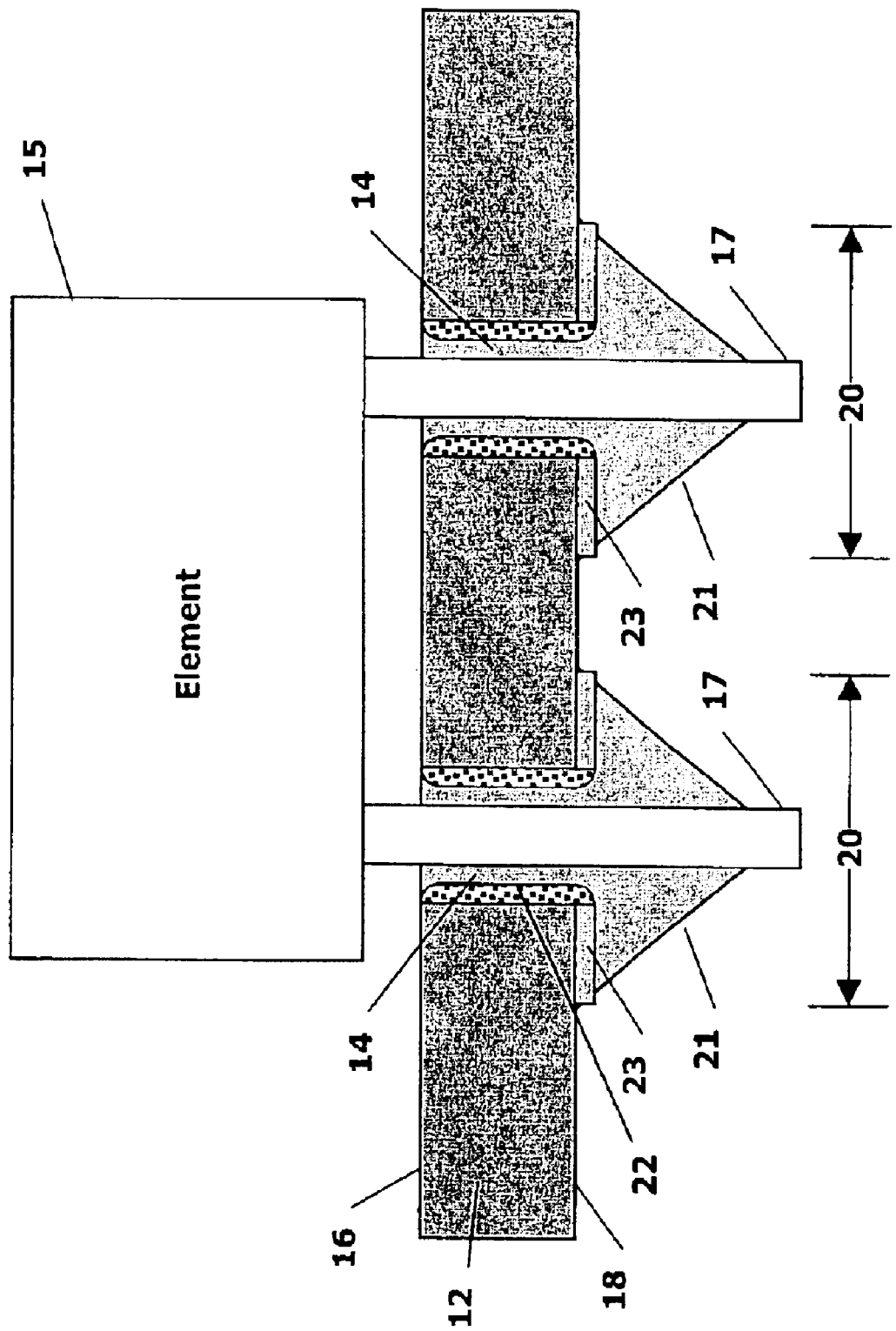
FIG. 1 is a cross-sectional view of a printed wiring board having an electronic element electrically connected thereto, according to aspects of the present invention.

Turning now to the drawings, wherein like numerals designate like components, FIG. 1 is a cross-sectional view of a printed wiring board 12 having electronic element 15 electrically connected thereto, in accordance with aspects of the present invention. Printed wiring board 12 may include one or more layers (not shown), including a base layer of an insulating material, such as phenol resin. A top side 16 of board 12 is designed for mounting one or more electronic elements, such as electronic element 15, which may be a semiconductor chip, an integrated circuit, an electronic component, and/or packages therefore or subassemblies thereof. Through-holes 14 extending through board 12 are configured to receive electrodes, such as conductive pins 17, associated with electronic element 15.

Terminal regions 20 (discussed further below) are areas along walls of through-holes 14, and may also include areas at or near perimeter of through-holes 14 on a bottom side 18 of board 12, where external terminals, such as solder terminals 21, may be applied. Terminal regions 20 are preferably substantially circular, but may be any desired shape, for example, rectangular or elliptical.

A conductive paste 22 is disposed on at least a portion of terminal regions 20, preferably at least in part lining walls of through-holes 14. The metal in conductive paste 22 is preferably copper, but may be another metal, such as silver, or silver-coated copper, or another metal. A suitable conductive paste 22 is produced by Tatsuta Cable & Wire Co., Ltd., in Japan, number SP6646. Conductive paste 22 is preferably screen-printed onto terminal regions 20 within through-holes 14 using, and in combination with, commonly-known techniques, such as pin insertion and removal, but may be applied in any desired manner.

A copper foil 23 may be disposed on at least a portion of terminal regions 20, in a circular shape in the area surrounding a perimeter of through-holes 14. Copper foil 23 is typically referred to as copper clad laminate, and is a substantially pure copper metal.

FIG. 2 is a partial view of through-holes 14 shown in FIG. 1, prior to mounting element 15 to board 12. Oxidation 200 has formed on the surface of conductive paste 22 in at least a portion of terminal regions 20 within through-holes 14.

As shown in FIG. 3, with reference to FIGS. 1 and 2, oxidation-reduced regions 300 are formed on at least a portion of conductive paste 22 in terminal regions 20, according to an aspect of the present invention. Oxidation-reduced regions 300 are areas of conductive paste 22 where oxidation 200 is removed, or reduced, by application of an acid to conductive paste 22, preferably using an acid wash or etching of $H_2SO_4$, $H_2O_2$, or HCL and water. A thickness of oxidation removed is preferably approximately 0.5 microns or less, and may be up to 1.0 microns, although an amount of oxidation removed or reduced may vary. The acid may be applied according to well-known methods, but a suitable application technique includes: a decreasing step; a water rinsing step, using both circulating water pressurized at approximately 0.8 $kg/cm^2$, and water pressurized at approximately 2.5 $kg/cm^2$; soft etching with an acid having a concentration of 20.6% $H_2SO_4$, 6.7% $H_2O_2$, and 72.7% water at a temperature, etching rate and pressure sufficient to remove the desired amount of oxidation (for example, at approximately 26 degrees Celcius, 0.5–1.5 micrometers, and 0.5–1.0 $kg/cm^2$, respectively); and rinsing, using both circulating water pressurized at approximately 0.8 $kg/cm^2$, and water pressurized at approximately 2.5 $kg/cm^2$.

In accordance with another aspect of the present invention, as illustrated in FIGS. 4–6, an oxidation-prevention layer is formed on oxidation-reduced regions 300, to prevent further oxidation. In a first preferred embodiment of the oxidation-prevention layer, depicted in FIGS. 4 and 5, a layer of solder (discussed further below) having a preferable thickness of between about one and 30 microns is formed on oxidation-reduced regions 300.

FIG. 4 illustrates a first step in forming the layer of solder-deposition of a flux 400 on oxidation-reduced regions 300. Second, as shown in FIG. 5, oxidation-prevention layer is formed by application of solder 500 to flux 400. A hot-air solder leveler (HASL) technique, which is well-known, is preferably used to deposit flux 400 and to apply solder 500, in which oxidation-reduced regions 300 are soaked by liquid flux, the flux-soaked regions are dipped vertically into a solder bath, and a heated gas, such as air, is blown by the melted solder. Foil (not shown) may subsequently be deposited on the surface of solder 500, to provide a non-contact surface-finish. Solder 500 may be any type of solder, including but not limited to a typical Eutetics-type solder, composed of approximately 63% tin and 37% lead, or a lead-free solder, composed of, for example, approximately 96.5% tin, 2% silver, 1% copper, and 0.5% bismuth. A suitable solder bath for the Eutetics-type solder is approximately 240–250 degrees Celcius for three-to-five seconds, while a solder bath for the lead-free solder may be approximately 250–260 degrees Celcius for three-to-five seconds.

FIG. 6 illustrates a second preferred embodiment of the oxidation-prevention layer. Layer 600, which is a preflux deposited on a rustproof agent, is formed on oxidation-reduced regions 300. To apply layer(s) 600, oxidation-reduced regions 300 are preferably first soaked in a rustproof agent, such agents being well-known and widely available, then rinsed, using water, for example, and coated by a preflux material, such as rosin, disposed in a solvent-like thinner.

Referring again to FIG. 1, applying solder terminal 21 to conductive pin 17 and terminal regions 20, which have been prepared in accordance with aspects of the present invention, will further the consistency and stability of the electrical connection between element 15 and printed wiring board 12, reduce the introduction of impurities into solder baths, and provide durability during subsequent solder operations, such as manual repair operations performed using solder irons.

Figure 7:
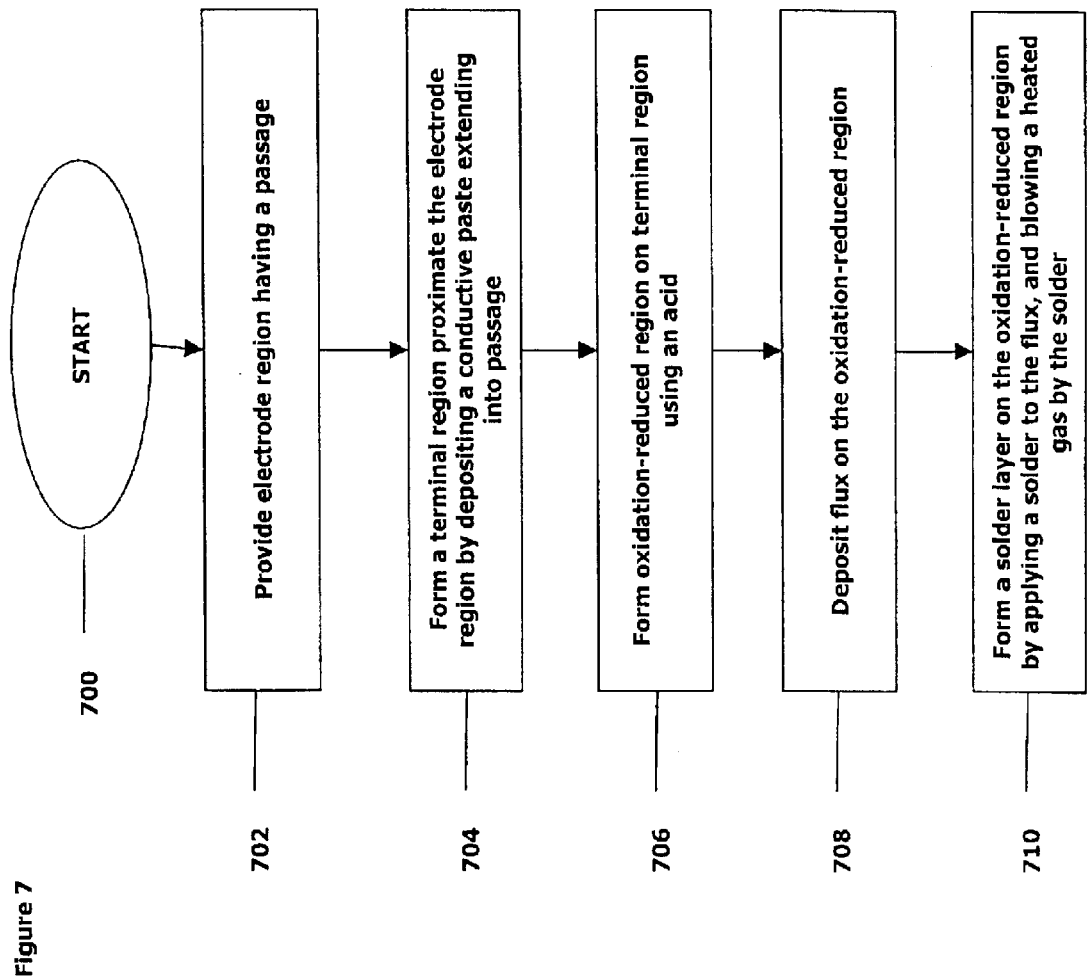
FIG. 7 is a flowchart of a first method for manufacturing a printed wiring board, according to a still further aspect of the present invention.

Thus, as illustrated in FIG. 7, starting at block 700, a method for manufacturing a printed wiring board in accordance with an aspect of the present invention may include a first step 702, of providing an electrode region having a passage on a base. A next step 704 includes forming a terminal region proximate the electrode region, by depositing a conductive paste at least in part extending into the passage. At step 706, an oxidation-reduced region is formed on the terminal region using an acid, and, at step 708, a flux is deposited on the oxidation-reduced region. A solder layer is formed on the oxidation-reduced region at final step 710, by applying a solder to the flux, and blowing a heated gas by the solder.

Figure 8:
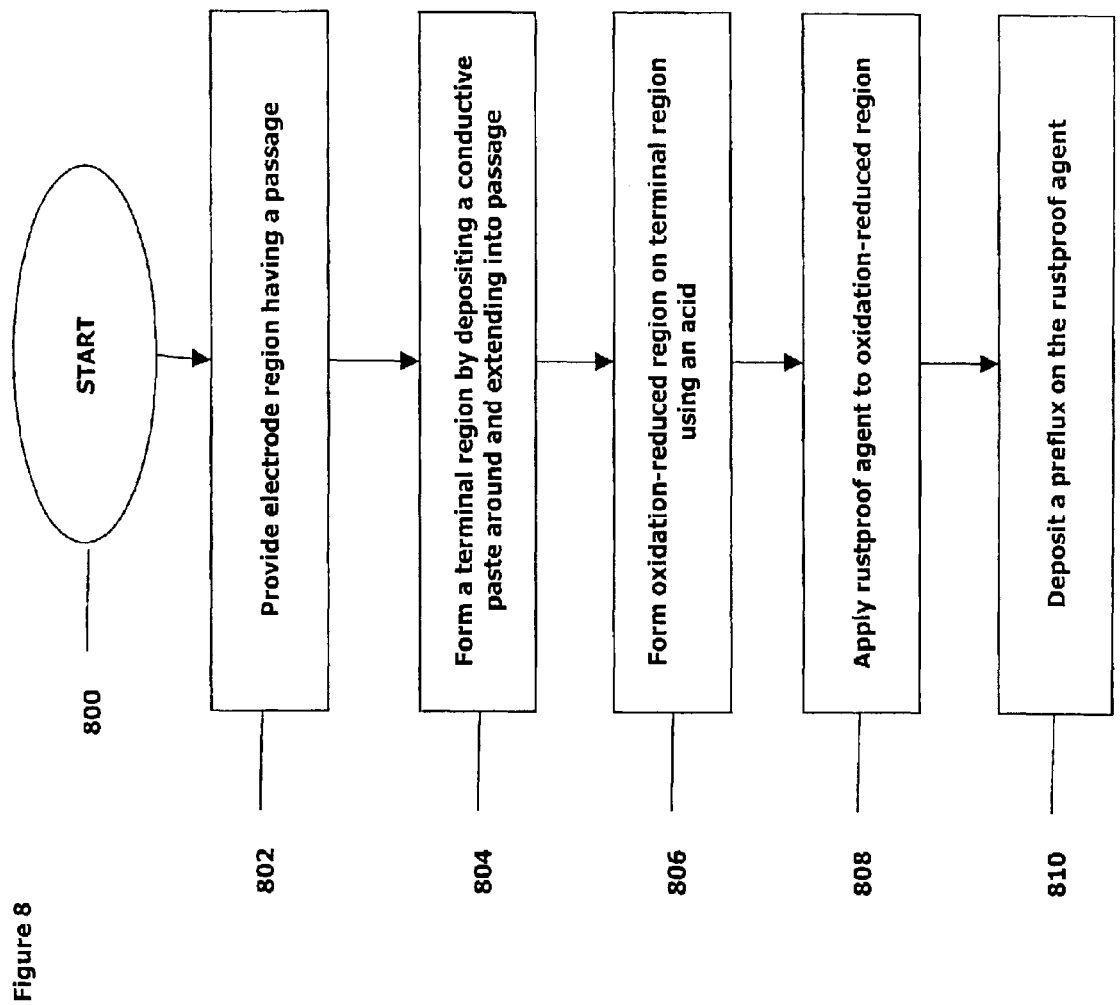
FIG. 8 is a flowchart of a second method for manufacturing a printed wiring board, according to a still further aspect of the present invention.

FIG. 8 illustrates a second method for manufacturing a printed wiring board in accordance with an aspect of the present invention, starting at block 800. At first step 802, an electrode region having a passage is provided on a base. A next step 804 includes forming a terminal region proximate the electrode region, by depositing a conductive paste at least in part extending into the passage. At step 806, an oxidation-reduced region is formed on the terminal region using an acid, and, at step 808, a rustproof agent is deposited on the oxidation-reduced region. A preflux is applied to the rustproof agent at final step 810.

Although apparatuses and methods herein have been shown as being associated with a printed wiring board, the aspects of the present invention applicable to printed wiring boards are also applicable to other types of substrates and/or electronic elements, including but not limited to electronic dies, components, packages and sub-assemblies.

It will be apparent that other and further forms of the invention, and embodiments other than the specific embodiments described above, may be devised without departing from the spirit and scope of the appended claims and their equivalents, and therefore it is intended that the scope of this invention will only be governed by the following claims and their equivalents.

What is claimed is:

1. A printed wiring board, comprising:
a base having an electrode region configured to receive an electrode associated with an electronic element;
a terminal region proximate the electrode region;
a conductive paste deposited on at least a portion of the terminal region, the conductive paste having an oxidation-reduced region thereon, the oxidation-reduced region formed on only a portion of the conductive paste in said terminal region by application of an acid to the conductive paste, wherein the acid removes oxidation on the surface of said conductive paste; and
an oxidation-prevention layer formed only on the oxidation-reduced region by deposition of a flux on the oxidation-reduced region, application of a solder to the flux, and blowing of a heated gas by the solder, the oxidation-prevention layer adapted to bond the electrode associated with the electronic element to the conductive paste by soldering, when the electrode is present in the electrode region.

2. The printed wiring board according to claim 1, wherein a thickness of the oxidation-prevention layer is between 1 to 30 microns.

3. The printed wiring board according to claim 1, wherein the acid is selected from the group consisting of: H2S04, H202 and HCL.

4. The printed wiring board according to claim 3, wherein the acid is applied via an etching process.

5. The printed wiring board according to claim 1, wherein the conductive paste comprises a copper paste.

6. The printed wiring board according to claim 1, wherein the electrode region comprises a passage through the base.

7. The printed wiring board according to claim 6, wherein the electrode comprises a pin associated with the electronic element.

8. An apparatus for electrically connecting an electronic element and a base, comprising:
an electrode region;
a terminal region proximate the electrode region;
a conductive paste deposited on at least a portion of the terminal region, the conductive paste having an oxidation-reduced region thereon, the oxidation-reduced region formed on only a portion of the conductive paste in said terminal region by application of an acid to the conductive paste, wherein the acid removes oxidation on the surface of said conductive paste; and
an oxidation-prevention layer formed only on the oxidation-reduced region by deposition of a flux on the oxidation-reduced region, application of a solder to the flux, and blowing of a heated gas by the solder, the oxidation-prevention layer adapted to bond the electrode associated with the electronic element to the conductive paste by soldering, when the electrode is present in the electrode region.

9. The apparatus according to claim 8, wherein the base is selected from the group consisting of: a printed wiring board, a component package, and a semiconductor die.

10. An apparatus for electrically connecting an electronic element and a base, comprising:
an electrode region; a terminal region proximate the electrode region;
a conductive paste deposited on at least a portion of the terminal region, the conductive paste having an oxidation-reduced region thereon, the oxidation-reduced region formed on only a portion of the conductive paste in said terminal region by application of an acid to the conductive paste; wherein the acid removes oxidation on the surface of said conductive paste; and
an oxidation-prevention layer formed only on the oxidation-reduced region by applying a rustproof agent to the oxidation-reduced region, and depositing a preflux onto the rustproof agent, the oxidation-prevention layer adapted to bond the electrode associated with the electronic element to the conductive paste by soldering, when the electrode is present in the electrode region.

11. The apparatus according to claim 10, wherein the base is selected from the group consisting of: a printed wiring board, a component package, and a semiconductor die.

* * * * *